(12) United States Patent
Tsai et al.

(10) Patent No.: US 7,805,165 B2
(45) Date of Patent: Sep. 28, 2010

(54) LOADING-ADJUSTABLE RF SWITCH MATRIX CIRCUIT AND DRIVING METHOD THEREOF

(75) Inventors: Ho-Chang Tsai, Hsin-Chu Hsien (TW); Kuang-Yu Hsu, Tao-Yuan (TW)

(73) Assignee: AMIC Communication Corporation, Science-Based Industrial Park, Hsin-Chu (TW)

( * ) Notice: Subject to any disclaimer, the term of this patent is extended or adjusted under 35 U.S.C. 154(b) by 1609 days.

(21) Appl. No.: 10/906,706

(22) Filed: Mar. 3, 2005

(65) Prior Publication Data

US 2006/0121847 A1 Jun. 8, 2006

(30) Foreign Application Priority Data

Dec. 7, 2004 (TW) .............................. 93137817 A

(51) Int. Cl.
*H04B 1/38* (2006.01)
(52) U.S. Cl. ......................................... 455/557; 725/71
(58) Field of Classification Search ................ 455/3.02, 455/3.01, 3.06, 556.1, 557; 725/62, 63
See application file for complete search history.

(56) References Cited

U.S. PATENT DOCUMENTS

| 5,565,805 | A | * | 10/1996 | Nakagawa et al. ............ 327/99 |
| 5,754,118 | A | | 5/1998 | Brunner |
| 6,346,744 | B1 | | 2/2002 | Geller |
| 6,661,252 | B2 | | 12/2003 | Nagano et al. |

\* cited by examiner

*Primary Examiner*—Tu X Nguyen
(74) *Attorney, Agent, or Firm*—Winston Hsu; Scott Mergo; Min-Lee Teng

(57) ABSTRACT

A loading-adjustable RF switch matrix circuit includes a first output unit for selectively outputting at least one RF signal, at least one signal switching module, and a detecting module coupled to the first output unit and the signal switching module. The signal switching module includes a first loading unit for adjusting the loading of the RF switch matrix circuit; a first switch unit coupled to the RF signal, the first loading unit and the first output unit for controlling the RF signal coupled to the first loading unit or the first output unit. If the detecting module detects that the first output unit is not coupled to a first external device, the first switch unit couples the RF signal to the first loading unit.

31 Claims, 2 Drawing Sheets

LOADING-ADJUSTABLE RF SWITCH MATRIX CIRCUIT AND DRIVING METHOD THEREOF

BACKGROUND OF INVENTION

1. Field of the Invention

The present invention relates to an RF switch matrix circuit and driving method thereof, and more particularly, to a loading-adjustable RF switch matrix circuit and driving method thereof.

2. Description of the Prior Art

Due to the rapid development of wireless communication systems, wireless devices offering great convenience are widely used in daily communications. With wireless devices, people are able to exchange information, share experiences, and communicate with each other anytime and anywhere. Because of the wide usage of wireless devices, a broad range of new wireless products are being developed. As indicated by Brunner, et al. in U.S. Pat. No. 5,754,118, an RF switch matrix is applied to wireless communication such as digital satellite broadcasting (DSB) and digital video broadcasting (DVB).

Please refer to FIG. 1. FIG. 1 is a schematic diagram of a prior art RF switch matrix circuit. The RF switch matrix circuit 100 is a 4×2 RF switch matrix circuit comprising: a plurality of switches 100a; a plurality of input nodes IN-A, IN-B, IN-C and IN-D; and a plurality of output nodes OUT-1 and OUT-2. A plurality of RF signals $RF_a$, $RF_b$, $RF_c$, and $RF_d$ are inputted into the input nodes IN-A, IN-B, IN-C and IN-D respectively, and then chosen by the plurality of switches 100a. The RF signal $RF_1$ of output node OUT-1 could be one of the RF signals $RF_a$, $RF_b$, $RF_c$, or $RF_d$. The other RF signal $RF_2$ of output node OUT-2 could be one of the RF signals $RF_a$, $RF_b$, $RF_c$, or $RF_d$. Generally speaking, the output nodes OUT-1 or OUT-2 in the RF switch matrix circuit 100 can further be coupled to the outside set-top box (STB) through outside amplifiers.

For the RF switch matrix circuit 100, the STB can be taken as a loading resistance having a specific impedance such as 75 ohms. When one of the output nodes OUT-1 or OUT-2 does not couple to the outside STB, the output loading of the RF switch matrix circuit 100 will change. This change of output loading will further affect the plurality of switches 100a inside the RF switch matrix circuit 100, and finally cause bad isolation between the plurality of switches 100a. For example, if the plurality of switches 100a choose RF signals $RF_a$ and $RF_d$ to become output signals through proper control and a user does not connect an STB to the output node OUT-1, the RF signal $RF_a$ will couple to output node OUT-2 through switches 100a inside the RF switch matrix circuit 100, and therefore interfere with the RF signal $RF_d$ of output node OUT-2.

SUMMARY OF INVENTION

One objective of the claimed invention is therefore to provide an RF switch matrix circuit and driving method of adjusting an inner circuit to control loading when the outside loading changes, to solve the above-mentioned problems.

According to an exemplary embodiment of the claimed invention, a loading-adjustable RF switch matrix circuit is disclosed comprising a first output unit for selectively outputting at least one RF signal; at least one signal switching module; and a detecting module coupled to the first output unit and the signal switching module. The signal switching module comprises a first loading unit for adjusting the loading of the RF switch matrix circuit; and a first switch unit coupled to the RF signal, the first loading unit, and the first output unit, for controlling the RF signal to connect to the first loading unit or the first output unit. If the detecting module detects the first output unit does not connect to the first outside device, the first switch unit will couple the RF signal to the first loading unit.

According to another exemplary embodiment of the claimed invention, a driving method is disclosed. The RF switch matrix circuit comprises a first output unit for selectively outputting at least one RF signal. The driving method comprises the following steps: providing a first loading unit for adjusting the loading of the RF switch matrix circuit; and detecting whether the first output unit connects to a first outside device. If the detecting result is that the first output unit does not connect to the first outside device, the RF signal will couple to the first loading unit rather than the first output unit.

The present invention RF switch matrix circuit has a plurality of loading units. When one of the output units of the RF switch matrix circuit does not connect to an outside device, the RF signal originally coupled to an output unit through a switch unit will couple to a loading unit through a switch unit. This can avoid the bad isolation from outside loading change. Therefore the present invention RF switch matrix circuit can substantially improve the quality of output signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
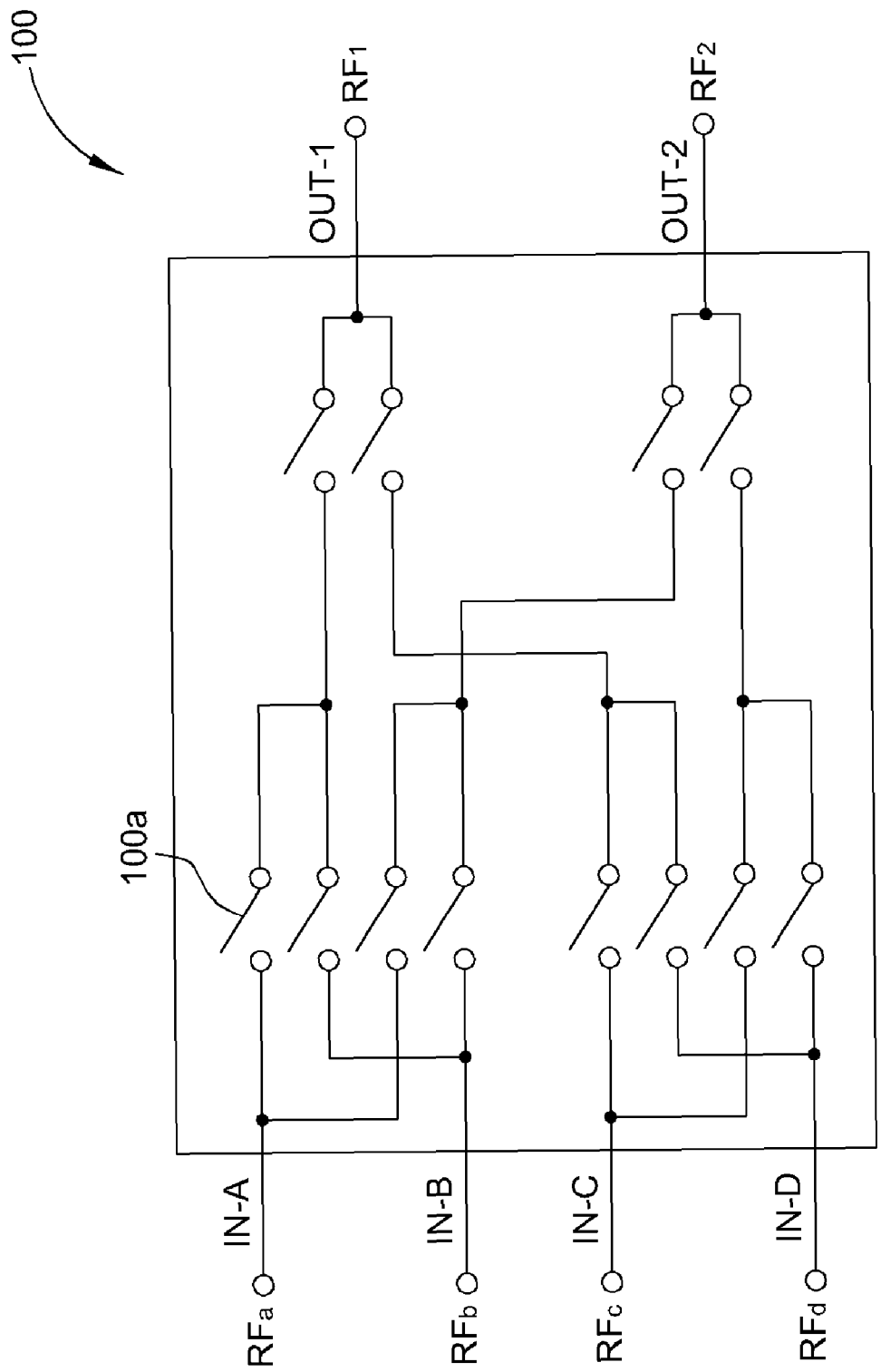
FIG. 1 is a schematic diagram of a prior art RF switch matrix circuit.
Figure 2:
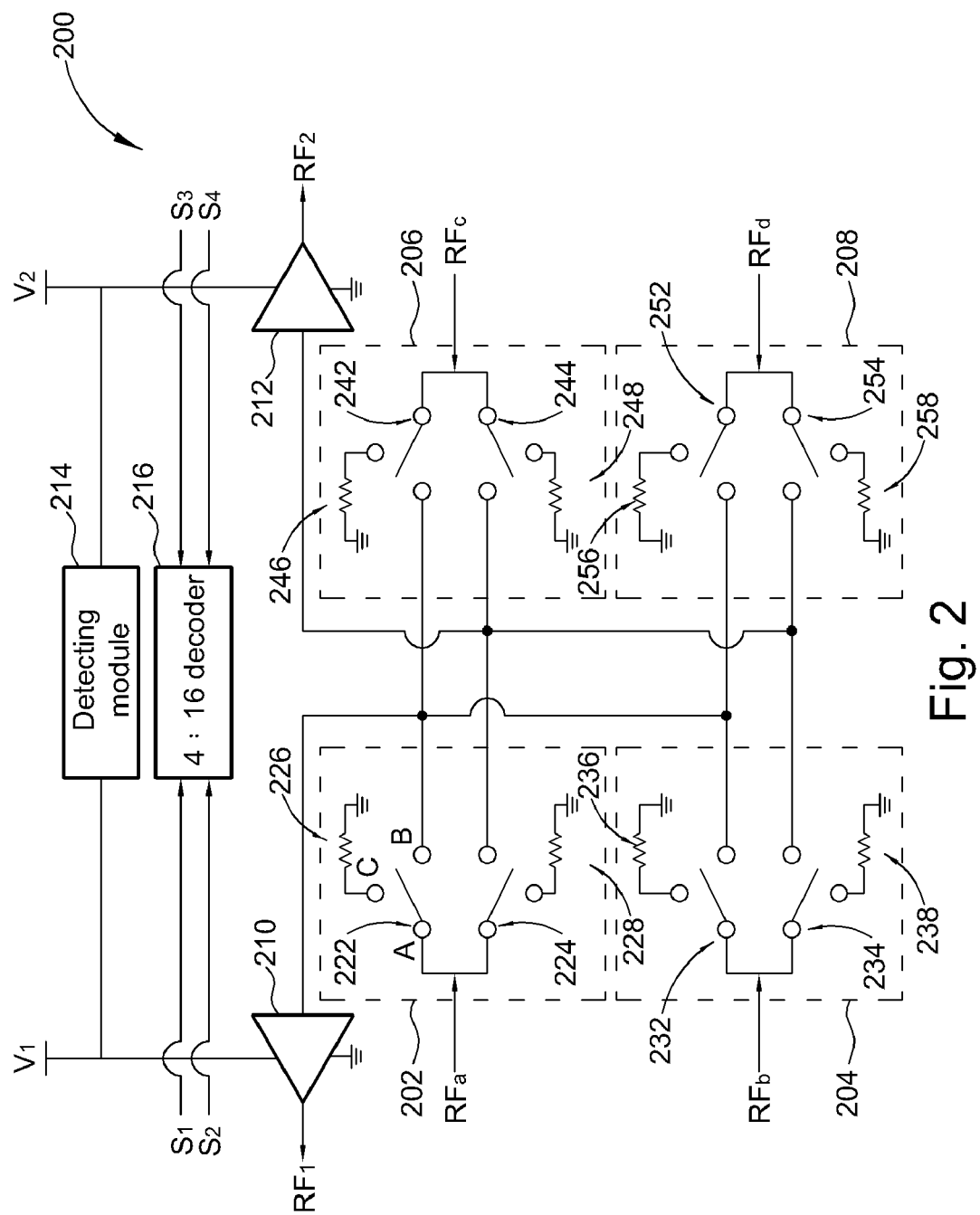
FIG. 2 is a circuit diagram of a RF switch matrix circuit according to an embodiment of the present invention.

Please refer to FIG. 2. FIG. 2 shows a circuit diagram of an RF switch matrix circuit according to an embodiment of the present invention. In this embodiment, the RF switch matrix circuit 200 is a 4×2 RF switch matrix circuit, which can be applied to wireless communication systems such as digital satellite broadcasting (DSB) and digital video broadcasting (DVB). Please note that the above mentioned 4×2 RF switch matrix circuit is one embodiment, and the present invention is not limited to 4×2 RF switch matrix circuits. For example, it can also be applied to a 4×4 RF switch matrix circuit. The RF switch matrix circuit 200 comprises: a plurality of signal switching modules 202, 204, 206 and 208; a plurality of output units 210 and 212; a detecting module 214; and a 4:16 decoder 216. The signal switching modules 202, 204, 206 and 208 all have the same circuit function and structure. The signal switching module 202 comprises a plurality of switch units 222 and 224, and a plurality of loading units 226 and 228. The signal switching module 204 comprises a plurality of switch units 232 and 234, and a plurality of loading units 236 and 238. The signal switching module 206 comprises a plurality of switch units 242 and 244, and a plurality of loading units 246 and 248. Finally, the signal switching module 208 comprises a plurality of switch units 252 and 254, and a plurality of loading units 256 and 258. Additionally, as shown in FIG. 2, in this embodiment the RF switch matrix circuit 200 utilizes an amplifier to apply to output units 210 and 212, and utilizes a resistance to apply to loading units 226, 228, 236, 238, 246, 248, 256 and 258. The function of each element in the RF switch matrix circuit 200 is detailed below.

Signal switching modules 202, 204, 206 and 208 selectively couple the RF signals $RF_a$, $RF_b$, $RF_c$ and $RF_d$ to output units 210 and 212 or to loading units 226, 228, 236, 238, 246, 248, 256 and 258. Loading units 226, 228, 236, 238, 246, 248, 256 and 258 are then utilized to adjust loading of the RF switch matrix circuit 200 to improve the isolation of switch units 222, 224, 232, 234, 242, 244, 252 and 254 when outside loading changes. The detailed description will be discussed later. A 4:16 decoder 216 is utilized to control signal switching modules 202, 204, 206 and 208 to choose two of the RF signals $RF_a$, $RF_b$, $RF_c$ or $RF_d$ to couple to output units 210 and 212 according to the plurality of selecting signals S1, S2, S3 and S4. If the outputs of output units 210 and 212 connect to an outside device such as the STB, the output units 210 and 212 can get bias voltages $V_1$, and $V_2$ from the corresponding outside devices. In other words, bias voltages $V_1$, and $V_2$ can enable output units 210 and 212 to amplify the selected RF signals to output RF signals $RF_1$ and $RF_2$ to the outside device. The detecting module 214 is coupled to output units 210 and 212 to detect whether bias voltages $V_1$, and $V_2$ exist in output units 210 and 212 to determine if outside devices (not shown) are connected to the RF switch matrix circuit 200. As mentioned above, the needed bias voltages $V_1$, and $V_2$ of output units 210 and 212 are applied by outside devices. For example, if the detecting module 214 does not successfully detect the existence of bias voltage $V_1$, the detecting module 214 then determines that the output of output unit 210 does not connect to one of the outside devices.

The function of the RF switch matrix circuit 200 is now described in greater depth. If the RF switch matrix circuit 200 only selects RF signal $RF_a$ from RF signals $RF_a$, $RF_b$, $RF_c$ and $RF_d$ to be the output signal, the 4:16 decoder 216 drives switch units 222 and 224 to make RF signal $RF_a$ able to connect to both output units 210 and 212 through switch units 222 and 224 according to selecting signals $S_1$, $S_2$, $S_3$ and $S_4$. The other switch units 232, 234, 242, 244, 252 and 254 couple RF signals $RF_b$, $RF_c$ and $RF_d$ to corresponding loading units 236, 238, 246, 248, 256 and 258. Take switch unit 222 as an example; node A and node B connect to each other at this moment. When the output of output unit 220 connects to an outside device and the output of output unit 210 does not connect to an outside device, the detecting module 214 detects that the bias voltage $V_1$, of output unit 210 is smaller than a predetermined value. Therefore, when the bias voltage $V_1$, of output unit 210 is near ground level, the detecting module 214 determines the output of output unit 210 does not connect to an outside device. If the detecting module 214 detects that the bias voltage of output unit 220 is larger than a predetermined value, when the bias voltage $V_1$, of output unit 210 is near to the supply voltage of the outside device, the detecting module 214 determines the output of output unit 220 connects to an outside device. At the same time, the detecting module 214 has determined the output of output unit 210 does not connect to an outside device, so the detecting module 214 outputs a detecting signal to switch unit 222, which corresponds to the output unit 210 selected by the 4:16 decoder 216, in order to drive the switch unit 222 coupling RF signal $RF_a$ to loading unit 226. To switch unit 222, node A and node C connect to each other at this moment.

In this embodiment, loading units 226, 228, 236, 238, 246, 248, 256 and 258 are all resistances, and their resistance values correspond with the outside device connected to the RF switch matrix circuit 200. In other words, to the RF switch matrix circuit 200, if the equivalent impedance of the outside device is 75 ohms, loading units 226, 228, 236, 238, 246, 248, 256 and 258 are implemented with a resistance whose value is 75 ohms. When the output of output unit 210 does not actually connect to an outside device, the loading unit 226 is utilized to be an outside device to provide a proper impedance for improving the isolation of switch unit 222 when outside loading changes. In other words, when switch unit 222 couples the RF signal $RF_a$ to the loading unit 226, the RF signal $RF_a$ flowing through switch unit 222 does not interference with another RF signal $RF_a$ flowing through output unit 212.

Looking at another operation example, if the RF switch matrix circuit 200 selects RF signals $RF_a$ and $RF_c$ from RF signals $RF_a$, $RF_b$, $RF_c$ and $RF_d$ to be output signals, the 4:16 decoder 216 drives switch units 222 and 244 to make the RF signals $RF_a$ and $RF_c$ able to connect switch units 222 and 244 to output units 210 and 212 respectively, according to selecting signals $S_1$, $S_2$, $S_3$ and $S_4$. The other switch units 224, 232, 234, 242, 252 and 254 couple RF signals $RF_a$, $RF_b$, $RF_c$ and $RF_d$ to corresponding loading units 228, 236, 238, 246, 256 and 258.

However, when the outputs of output units 220 and 210 do not actually connect to an outside device, the detecting module 214 will detect that the bias voltage of the output unit 210 is near ground level. Because the detecting module 214 determines the output of output unit 210 does not connect to an outside device at this moment, the detecting module 214 will output a detecting signal to switch unit 222, which corresponds to the output unit 210 selected by the 4:16 decoder 216, for driving switch unit 222 to couple the RF signal $RF_a$ to the loading unit 226. The loading unit 226 is utilized to be an outside device to provide a proper impedance for improving the isolation of switch unit 222 when outside loading changes. In other words, when switch unit 222 couples the RF signal $RF_a$ to the loading unit 226, the RF signal $RF_a$ flowing through switch unit 222 does not interfere with another RF signal $RF_a$ flowing through output unit 212.

Please note that the other operations of switch units 232, 234, 244, 252 and 254 are the same as the above mentioned switch unit 226, 224 and 242. They all couple RF signals $RF_a$, $RF_b$, $RF_c$ and $RF_d$ to the corresponding loading units 236, 238, 248, 256 and 258 according to the detecting signal of the detecting module 214. Further discussion is omitted for the sake of brevity.

Compared with the prior art, the present invention RF switch matrix circuit has a plurality of loading units. When one of the output units of the RF switch matrix circuit does not connect to an outside device, the RF signal originally coupled to an output unit through a switch unit will couple to a loading unit through a switch unit. This can avoid bad isolation from outside loading changing. Therefore the present invention RF switch matrix circuit can substantially improve the quality of output signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An RF switch matrix circuit comprising:
a first output unit for selectively outputting at least one RF signal;
at least one signal switching module comprising:
a first loading unit for adjusting loading of the RF switch matrix circuit; and a first switch unit coupled to the RF signal, the first loading unit, and the first output unit for controlling the RF signal coupled to the first loading unit or the first output unit; and a detecting module coupled to the first output unit and the signal switching module;

wherein if the detecting module detects the first output unit is not coupled to a first outside device, the first switch unit will couple the RF signal to the first loading unit.

2. The RF switch matrix circuit of claim 1, wherein if the first output unit predetermines to output the RF signal and the detecting module detects the first output unit is not coupling to the first outside device, the first switch unit couples the RF signal to the first loading unit.

3. The RF switch matrix circuit of claim 1, wherein if the first output unit does not predetermine to output the RF signal, the first switch unit will directly couple the RF signal to the first loading unit.

4. The RF switch matrix circuit of claim 1, wherein the first loading unit is a resistor.

5. The RF switch matrix circuit of claim 1, wherein the first output unit is an amplifier.

6. The RF switch matrix circuit of claim 5, wherein if the detecting module detects that a bias voltage of the amplifier corresponding to the first output unit is smaller than a predetermined value, the first detecting signal is triggered.

7. The RF switch matrix circuit of claim 1, wherein the RF switch matrix circuit is applied to a digital satellite broadcasting (DSB) or a digital video broadcasting (DVB).

8. The RF switch matrix circuit of claim 7, wherein the first outside device is a set-top box (STB).

9. The RF switch matrix circuit of claim 1 further comprising a second output unit for selectively outputting the RF signal, wherein the signal switching module further comprises:

a second loading unit for adjusting the loading of the RF switch matrix circuit; and a second switch unit coupled to the RF signal, the second loading unit, and the second output unit, for controlling the RF signal coupled to the second loading unit or the second output unit;

wherein the detecting module further couples to the second output unit, and if the detecting module detects that the second output unit is not connected to a second outside device, the second switch unit couples the RF signal to the second loading unit.

10. The RF switch matrix circuit of claim 9, wherein if the first output unit predetermines to output the RF signal and the detecting module detects that the first output unit is not connected to the first outside device, the first switch unit couples the RF signal to the first loading unit; and if the second output unit predetermines to output the RF signal and the detecting module detects that the second output unit is not connected to the second outside device, the second switch unit couples the RF signal to the second loading unit.

11. The RF switch matrix circuit of claim 9, wherein if the first output unit does not predetermine to output the RF signal, the first switch unit directly couples the RF signal to the first loading unit; and if the second output unit does not predetermine to output the RF signal, the second switch unit directly couples the RF signal to the second loading unit.

12. The RF switch matrix circuit of claim 9, wherein the RF switch matrix circuit comprises a plurality of signal switching modules, coupled to the first and second output unit and the plurality of RF signals separately.

13. The RF switch matrix circuit of claim 12, wherein the RF switch matrix circuit is a 4×2 RF switch matrix circuit.

14. The RF switch matrix circuit of claim 1, wherein the RF switch matrix circuit comprises a plurality of signal switching modules, separately coupled to the first output unit and coupled to the plurality of RF signals.

15. The RF switch matrix circuit of claim 9 further comprising a third output unit for selectively outputting the RF signal, wherein the signal switching module further comprises:

a third loading unit for adjusting the loading of the RF switch matrix circuit; and a third switch unit coupled to the RF signal, the third loading unit, and the third output unit, for controlling the RF signal coupled to the third loading unit or the third output unit;

wherein the detecting module further couples to the third output unit, and if the detecting module detects that the third output unit is not connected to a third outside device, the third switch unit couples the RF signal to the third loading unit.

16. The RF switch matrix circuit of claim 15 further comprising a fourth output unit for selectively outputting the RF signal, wherein the signal switching module further comprises:

a fourth loading unit for adjusting the loading of the RF switch matrix circuit; and a fourth switch unit coupled to the RF signal, the fourth loading unit, and the fourth output unit, for controlling the RF signal coupled to the fourth loading unit or the fourth output unit;

wherein the detecting module further couples to the fourth output unit, and if the detecting module detects that the fourth output unit is not connected to a fourth outside device, the fourth switch unit couples the RF signal to the fourth loading unit.

17. The RF switch matrix circuit of claim 16, wherein the RF switch matrix circuit comprises a plurality of signal switching modules, coupled to the first, second, third and fourth output units and the plurality of RF signals separately.

18. The RF switch matrix circuit of claim 17, wherein the RF switch matrix circuit is a 4×4 RF switch matrix circuit.

19. A method for driving an RF switch matrix circuit comprising the following steps:

providing a first loading unit for adjusting the loading of the RF switch matrix circuit, and providing a first output unit for selectively outputting at least one RF signal;

detecting whether the first output unit is connected to a first outside device or not; and if a detecting result is that the first output unit does not connect to the first outside device, coupling the RF signal to the first loading unit rather than the first output unit.

20. The method of claim 19, wherein the coupling to the first loading unit step comprises: if the first output unit predetermines to output the RF signal and the first output unit is detected to not be connected to the first outside device, the RF signal is coupled to the first loading unit.

21. The method of claim 19 further comprising: if the first output unit does not predetermine to output the RF signal, the first switch unit is driven to couple the RF signal to the first loading unit.

22. The method of claim 19, wherein the adjusting step comprises utilizing a resistance to be the first loading unit.

23. The method of claim 19, wherein the adjusting step comprises utilizing an amplifier to be the first output unit.

24. The method of claim 23, wherein the detecting step comprises: if the bias voltage of the amplifier is detected to be smaller than a predetermined value, it detects that the first output unit does not connect to the first outside device.

25. The method of claim 19, which is applied to a digital satellite broadcasting (DSB) or a digital video broadcasting (DVB).

26. The method of claim 25, wherein the first outside device is a set-top box (STB).

27. The method of claim 19, wherein the RF switch matrix circuit further comprises a second output unit for selectively outputting the RF signal, and the method further comprises:
   providing a second loading unit for adjusting the loading of the RF switch matrix circuit;
   detecting whether the second output unit is connected to a second outside device or not and
   if a detecting result is that the second output unit does not connect to the second outside device, coupling the RF signal to the second loading unit rather than the second output unit.

28. The method of claim 27, wherein the coupling to the first loading unit step comprises: if the first output unit predetermines to output the RF signal and the first output unit is detected to not be connected to the first outside device, the RF signal is coupled to the first loading unit; and the coupling to the second loading unit step comprises: if the second output unit predetermines to output the RF signal and the second output unit is detected to not be connected to the second outside device, the RF signal is coupled to the second loading unit.

29. The method of claim 27 further comprising:
   if the first output unit does not predetermine to output the RF signal, the first switch unit is driven to directly couple the RF signal to the first loading unit; and
   if the second output unit does not predetermine to output the RF signal, the second switch unit is driven to directly couple the RF signal to the second loading unit.

30. The method of claim 23, wherein the RF switch matrix circuit further comprises a third output unit for selectively outputting the RF signal, and the method further comprises:
   providing a third loading unit for adjusting the loading of the RF switch matrix circuit;
   detecting whether the third output unit is connected to a third outside device or not; and
   if a detecting result is that the third output unit does not connect to the third outside device, coupling the RF signal to the third loading unit rather than the third output unit.

31. The method of claim 30, wherein the RF switch matrix circuit further comprises a fourth output unit for selectively outputting the RF signal, and the method further comprises:
   providing a fourth loading unit for adjusting the loading of the RF switch matrix circuit;
   detecting whether the fourth output unit is connected to a fourth outside device or not; and
   if a detecting result is that the fourth output unit does not connect to the fourth outside device, coupling the RF signal to the fourth loading unit rather than the fourth output unit.

* * * * *